United States Patent [19]
Nakajima

[11] Patent Number: 5,594,357
[45] Date of Patent: Jan. 14, 1997

[54] TESTING APPARATUS AND CONNECTION METHOD FOR THE TESTING APPARATUS

[75] Inventor: Hisashi Nakajima, Yamanashi-ken, Japan

[73] Assignees: Tokyo Electron Limited, Tokyo; Tokyo Electron Yamanashi Limited, Nirasaki, both of Japan

[21] Appl. No.: 568,284

[22] Filed: Dec. 6, 1995

Related U.S. Application Data

[62] Division of Ser. No. 246,334, May 19, 1994, Pat. No. 5,489,853.

[30] Foreign Application Priority Data

May 19, 1993 [JP] Japan .................................. 5-140166

[51] Int. Cl.$^6$ .................................................. G01R 31/02
[52] U.S. Cl. ............................................ 324/758; 324/757
[58] Field of Search ...................................... 324/754, 757, 324/758, 158.1

[56] References Cited

U.S. PATENT DOCUMENTS

5,254,939 10/1993 Anderson et al. ...................... 324/754
5,321,453 6/1994 Mori ....................................... 324/754

*Primary Examiner*—Ernest F. Karlsen
*Assistant Examiner*—Russell M. Kobert
*Attorney, Agent, or Firm*—Oblon, Spivak, McClelland, Maier & Neustadt, P.C.

[57] ABSTRACT

A testing apparatus has a probe card having a plurality of first contact elements to be put in contact with an object to be tested, and a plurality of electrodes electrically connected with the first contact elements, a test head to be shifted between a retreat position and a test position, for performing electrical measurement of the object in the test position, a cylindrical connection unit, having a plurality of second contact elements to be put in contact with the electrodes of the probe card in the test position, for electrically connecting the probe card with the test head, the connection member being movably supported by the test head, a head plate for supporting the probe card, a driving mechanism for moving the probe card between a test position near the head plate and a wait position away from the head plate, and a movement limiting member for limiting movement of the connection member towards the test head and applying a pressing force to the connection member and the probe card via the second contact portions in cooperation with the driving mechanism, when the probe card is shifted from the wait position to the test position by the driving mechanism.

11 Claims, 6 Drawing Sheets

TESTING APPARATUS AND CONNECTION METHOD FOR THE TESTING APPARATUS

This is a division of application Ser. No. 08/246,334 filed on May 19, 1994, now U.S. Pat. No. 5,489,853.

BACKGROUND OF THE INVENTION

1. Field of the Invention

The present invention relates to a testing apparatus for testing electrical characteristics of, for example, a semiconductor wafer, and a connection method for the testing apparatus.

2. Description of the Related Art

In manufacture of semiconductor devices, a number of semiconductor devices are formed on a semiconductor wafer, and the devices are severed from each other. In such a semiconductor device fabric process, a probe apparatus has conventionally been and electrical characteristics of semi-finished semiconductor devices, which are still in the form of the semiconductor wafer, are tested.

The probe apparatus has a number of probes which can be put in contact with electrode pads of each chip on the semiconductor wafer. When the probes are put in contact with the pads of each chip, various measurement patterns supplied from a tester are delivered to each chip. An output pattern from each chip is monitored by the probe apparatus. As a result, the electrical characteristics of each chip on the semiconductor wafer are tested.

The probe apparatus has, for example, a structure wherein a test head including a test circuit, etc. is movable between a test position and a retreat position to which the test head is retreated from the test position. In the test position the test head is put in contact with the contact points of a probe card. When the test head is moved to the retreat position, the test head is put out of contact with the contact points. While the test head is in the retreat position, for example, exchange of the probe card is performed in the testing apparatus.

A connection unit is provided between the test head and the probe card for connecting the test head and the probe card. An upper portion of the connection unit has a plurality of terminals to be connected to the wires of the test head, and a lower portion of the connection unit is provided with a plurality of pogo pins functioning as extendible contact elements connected to the terminals. When the pogo pins are put in pressure contact with the electrode portions of the probe card, the pogo pins retreat and by virtue of urging force of springs housed within the connection unit the pogo pins are put in contact with the electrode portions under proper pressure. The connection unit is attached to the test head. When the test head is situated in the test position, the connection unit is fixed to the head plate. A probe card holder which holds the probe card is attached to the head plate.

In the conventional structure, when the test head is swung and connected to the probe card, a virtual plane defined by tip portions of the probes supported by the probe card is not parallel to the wafer to be tested. Consequently, the probes may not come into good contact with the semiconductor wafer.

Specifically, when the test head is swung to the connection position for connection with the probe card, a pressure acts on the probe card holder and a bending moment occurs in the head plate. In particular, when the number of pogo pins functioning as contact elements is great, a considerably great contact load is needed to bring all pogo pins into uniform contact with the electrode portions of the probe card. For example, if a contact load for one pogo pin of the connection unit is 100 g and the number of pogo pins is 1000, a load of about 100 kg acts on the head plate. As a result, the head plate is deformed by the bending moment and consequently the probe card may be deformed. The degree of bending deformation of the head plate in this case may reach 100 to 250 μm or thereabout, although it depends on the strength of the head plate.

If the head plate is deformed, the conditions for contact between the semiconductor wafer and the probe, which are set before the test head is brought to the connection position, e.g. the contact angle and contact position, will vary. If the contact angle varies, the tip portions of the probes will be inclined and the optimal contact in a direction perpendicular to the electrode pads will not be effected. In addition to the variation in contact angle of the probes, displacement of the probes and breakage of the probes may occur. More specifically, if the head plate is deformed, the distance between the probes and the object to be tested varies. In a region where the distance between the probe and the test object is short, the probe may be buckled and broken, or the position of the probe tip may be displaced.

There is another problem in the conventional apparatus in that proper contact between the probe card and the pogo pins is not easily attained, for the following reason.

A support shaft, around which the test head rotates, is normally situated on the upper portion of the head plate. One reason for this is that a passage for automatically exchanging the probe card is defined within the head plate and interference with peripheral devices must be prevented. Besides, since reduction in measuring is demanded in tester specifications, the contact position between the probe card and pogo pins is set at a place near the wafer table within the probe apparatus. Accordingly, a great distance is present between the axis of the support shaft and the contact plane between the pogo pins and the probe card. Thus, when the test head is swung, pogo pins situated near the support shaft come into contact with electrode portions of the probe card earlier than pogo pins situated away from the support shaft. As a result, the pogo pins near the support shaft slide on the electrodes of the probe card until the pogo pins away from the support shaft come into contact with the electrodes of the probe card, and displacement of contact positions may occur in this region where the pogo pins near the support shaft are situated or a contact pressure increases abnormally. Consequently, pogo pins may be broken. This undesirable phenomenon becomes conspicuous as the distance between the axis of the support shaft and the contact plane between the pogo pins and probe card increases.

SUMMARY OF THE INVENTION

An object of the present invention is to provide a testing apparatus wherein good parallelism is maintained between a virtual plane defined by tip portions of contact portions such as probes supported by a probe card and an object to be tested, whereby the contact portions are stably put in contact with the object.

Another object of the invention is to provide a testing apparatus and a connection method for the testing apparatus, wherein bending deformation of a head plate and a probe card is prevented, thereby optimizing the contact condition between contact portions such as probes and an object to be tested.

Still another object of the invention is to provide a testing apparatus of the type in which a test head is swung between a test position and a retreat position and a connection method for the testing apparatus, wherein contact elements such as probes provided on the test head side can constantly be put in stable contact with a probe card.

According to a first aspect of the invention, there is provided a testing apparatus comprising:

a probe card having a plurality of first contact elements to be put in contact with an object to be tested, and a plurality of electrodes electrically connected with the first contact elements;

a test head to be shifted between a retreat position and a test position, for performing electrical measurement of the object in the test position;

a connection member, having a plurality of second contact elements to be put in contact with the electrodes of the probe card in the test position, for electrically connecting the probe card with the test head, the connection member being movably supported by the test head;

a head plate for supporting the probe card;

moving means for moving the probe card between a test position near the head plate and a wait position away from the head plate; and a movement limiting member for limiting movement of the connection member towards the test head and applying a pressing force to the connection member and the probe card via the second contact elements in cooperation with the moving means, when the probe card is shifted from the wait position to the test position by the moving means.

According to a second aspect of the invention, there is provided a testing apparatus comprising:

a probe card having a plurality of first contact elements to be put in contact with an object to be tested, and a plurality of electrodes electrically connected with the first contact elements;

a test head to be shifted between a retreat position and a test position, for performing electrical measurement of the object in the test position;

a connection member, having a plurality of second contact elements to be put in contact with the electrodes of the probe card in the test position, for electrically connecting the probe card with the test head, the connection member being supported by the test head;

a support mechanism for movably supporting the connection member on the test head;

guide means for guiding the connection member such that the second contact elements are aligned to the electrodes of the probe card in the test position;

limiting means for limiting movement of the connection member towards the test head after the test head is moved to the test position; and fixing means for fixing the probe card in the state in which movement of the connection member is limited by the limiting means and the probe card is pressed on the connection member.

According to a third aspect of the invention, there is provided a connection method for connecting a test head and a probe card in a testing apparatus comprising the probe card having a plurality of first contact elements to be put in contact with an object to be tested, and a plurality of electrodes electrically connected with the first contact elements; the test head to be shifted between a retreat position and a test position, for performing electrical measurement of the object in the test position; and a connection member, having a plurality of second contact elements to be put in contact with the electrodes of the probe card in the test position, for electrically connecting the probe card with the test head, the connection member being movably supported by the test head, the connection method comprising the steps of:

moving the test head from the retreat position to the test position and fixing the test head;

limiting movement of the connection member towards the test head when the test head has been fixed in the test position; and moving the probe card towards the connection member and bringing the second contact elements into contact with the electrodes of the probe card with a pressing force.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Preferred embodiments of the present invention will now be described in detail with reference to the accompanying drawings.

Figure 1:
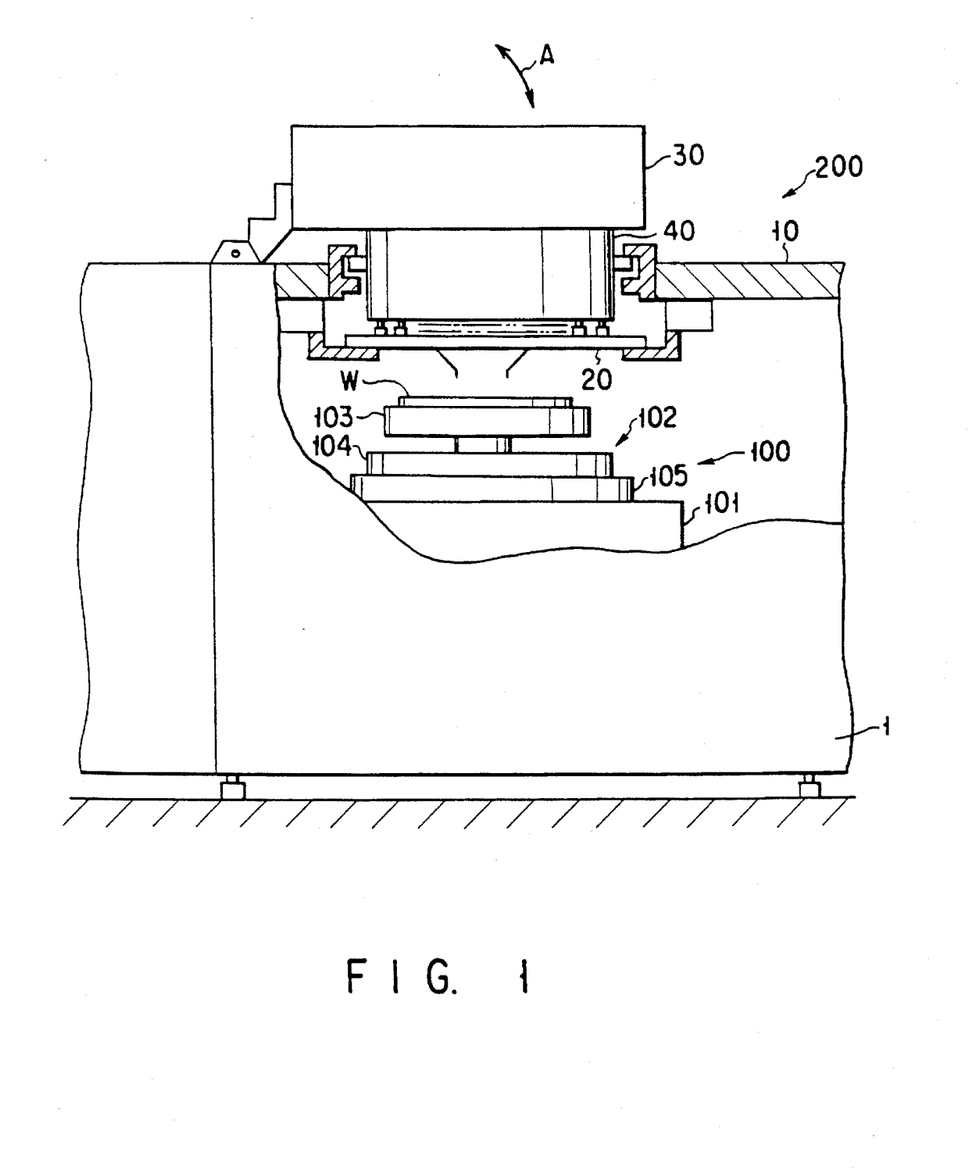
FIG. 1 shows schematically the entire structure of a testing apparatus according to an embodiment of the present invention.
Figure 2:
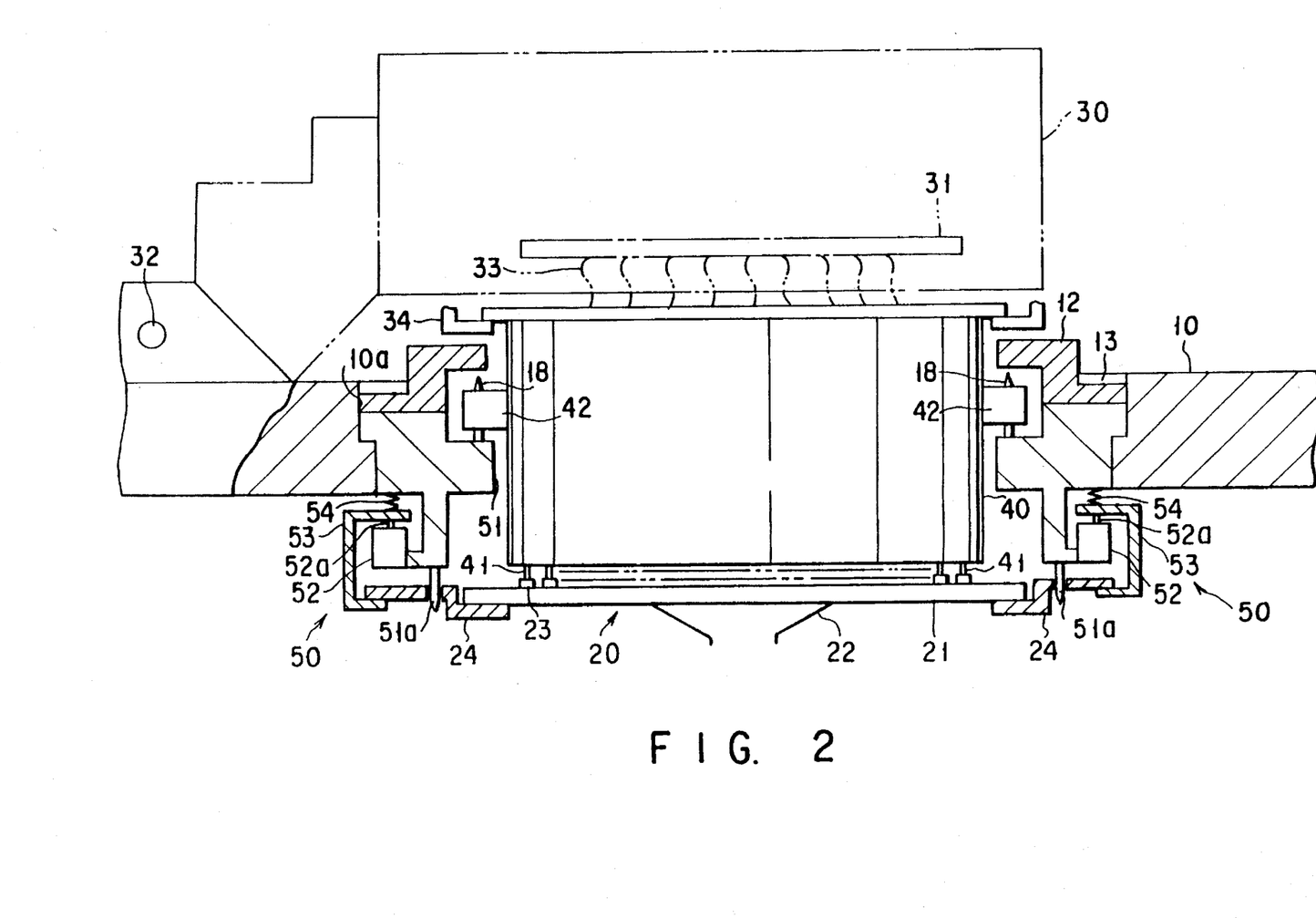
FIG. 2 shows schematically a main portion of the testing apparatus according to the embodiment in a state prior to the start of a testing operation.

FIG. 1 shows schematically the entire structure of a testing apparatus according to an embodiment of the present invention, and FIG. 2 shows schematically a main portion of the testing apparatus according to the embodiment in a state prior to the start of a testing operation.

The testing apparatus is provided within a housing 1, and comprises an aligning unit 100 for aligning a semiconductor wafer W or an object to be tested (hereinafter referred to as "test object") and a testing unit 200 for performing a test.

The aligning unit 100 has a main stage 101 and a movement mechanism 102 provided thereon. The movement mechanism includes a z-θ stage 103 for supporting the semiconductor wafer W, which stage 103 is movable in a z-direction and a θ-direction, an x-stage 104 movable in an x-direction, and a y-stage 105 movable in a y-direction. Thus, the moving mechanism can move the semiconductor wafer W to a desired position.

The testing unit 200 has a probe card 20 situated to face the movement mechanism 102, a test head 30 for performing electrical measurement on the test object or semiconductor wafer W, and a connection unit 40 for electrically connecting the probe card 20 and test head 30. A head plate 10 is provided at the uppermost portion of the housing 1. In the test mode, the probe card 20 is supported by the head plate 10.

A circular hole 10a for insertion of the connection unit 40 is formed in the head plate 10. An engaging member 12 for engagement with the connection unit 40 is rotatably fitted in the hole 10a. Reference numeral 13

The probe card 20 comprises a substantially disc-like printed board 21, a plurality of probes 22 projecting downward from the printed board 21, and a plurality of electrode pads 23 provided on the printed board 21 so as to correspond to the probes 22. A lower peripheral portion of the probe card 20 is attached to a probe card holder 24 formed of stainless steel on the hike. The card holder 24 is shaped to have a surface for supporting and fixing the probe card 20 and a surface coupled to part of a driving mechanism 50 (described later).

The test head 30 contains a performance board 31 on which elements for testing electrical characteristics of the semiconductor wafer W are mounted. As will be described later, the test head 30 movably supports the connection unit 40. The test head 30 is swingable between a test position shown in FIG. 1 and a retreat position around a support shaft 32, as indicated by a double-headed arrow A in FIG. 1.

The connection unit 40 is cylindrical. A bottom portion of the connection unit 40 is provided with a plurality of pogo pins 41 which are elastically put in contact with the electrode pads of the probe card. The elastic force of the pogo pins 41 is exerted by coil springs (not shown) provided within the connection unit 40. The pogo pins 41 of the connection unit 40 are electrically connected to terminals of the performance board 31 by flexible wiring 33. By virtue of the flexible wiring 33, a movement margin of, e.g. about 3 mm is maintained between the connection ring 40 and the test head 30.

While being supported by the holder 24, the probe card 20 can be moved between a lower wait position and an upper test position by the driving mechanism 50. The driving mechanism 50 utilizes air pressure and includes an insert ring 51, an air cylinder 52, an elevating member 53, and a spring 54 or an urging member. In addition, guide pins 51a for guiding the card holder 24 are attached to a lower end portion of the insert ring 51.

The insert ring 51 can be exchanged in accordance with the size of the probe card 50, and the ring 51 is fixed to the head plate 10. The air cylinder 52 is attached to the insert ring 51. A piston 52a which can be projected and retreated by air pressure is inserted in the air cylinder 52. One end portion of the elevating member 53 is fixed to the piston 52a, and the other end portion is fixed to the card holder 24. The spring 54 exerts a force for urging the piston 52a downwards. Until the pressure in the cylinder 52 overcomes the urging force of the spring 54, the elevating member 53 is pressed down and the probe card 20 is kept in the wait position. On the other hand, if the pressure in the cylinder 52 exceeds the urging force of the spring 54, the card holder 24 rises along the guide pins 51a and the probe card 20 rises to the test position.

Figure 3:
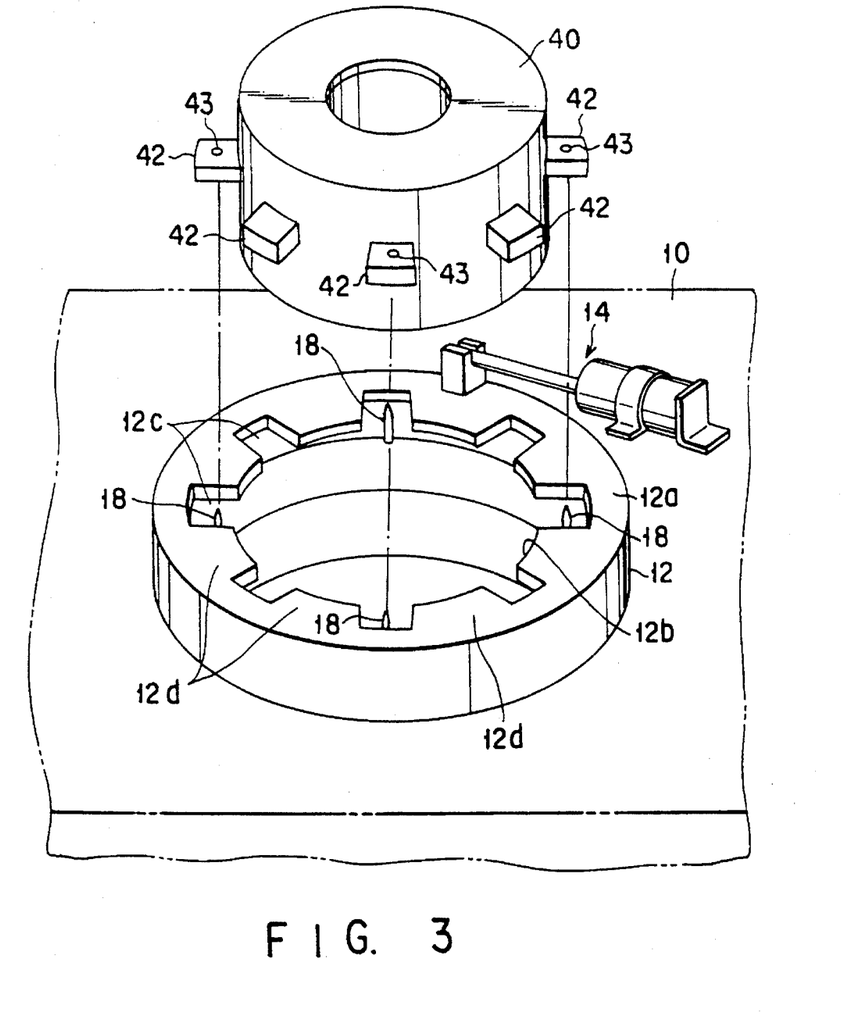
FIG. 3 is a perspective view showing an engaging portion and a connection ring of the testing apparatus according to the embodiment.

The relationship between the engaging member 12 and connection member 40 will now be described with reference to FIG. 3.

As described above, the engaging member 12 is rotatably fitted in the circular hole 10a of the head plate 10. The engaging member 12 is rotated by a driving member 14 such as an air cylinder in the circumferential direction of the hole 10a. The engaging member 12 is formed in a cylindrical shape with a ceiling wall 12a. A hole 12b for insertion of the connection unit 40 is formed in a central portion of the ceiling wall 12a. In addition, the ceiling wall 12a of the engaging member 12 is provided with notches 12c and stoppers 12d which are arranged alternately at regular intervals in the circumferential direction of the hole 12b. The stoppers 12d are formed by those portions of the ceiling wall 12a which are located between the notches 12c.

Figure 4:
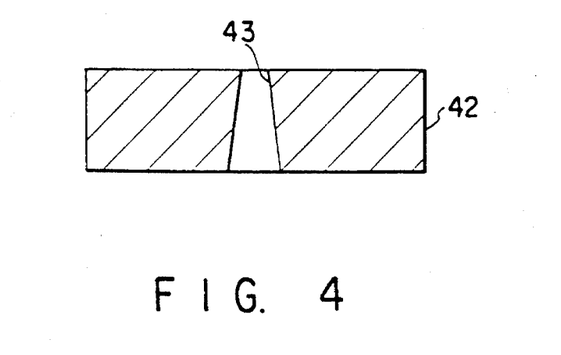
FIG. 4 is a cross-sectional view showing a flange with a hole of a connection ring.

Flanges 42 are projected radially from the outer peripheral wall of the connection unit 40 at intervals corresponding to the positions of the notches 12c of the engaging member 12. Through-holes 43 are formed in some of the flanges 42, for example, in every other flange 42, as shown in FIG. 3. Each hole 43 is tapered with a width gradually decreasing upwards as shown in FIG. 4. The insert ring 51 is provided with guide pins 18 having conical tip portions at positions corresponding to the holes 43 (refer FIG. 1), and the guide pins 18 function to position and guide the connection unit 40.

The driving member 14 shifts the engaging member 12 between a first position and a second position. In the first position, the flanges 42 of the connection unit 40 can enter the notches 12c. In the second position, the flanges 42, after inserted in the notches 12c, are situated below the stoppers 12d. When the engaging member 12 is set in the first position, the connection unit 40 is inserted in the hole 12b of the engaging member 12 in the state in which the flanges 42 situated to correspond to the notches 12c. During insertion of the connection unit, the guide pins 18 are inserted in the holes 43 and the connection unit 40 is guided. Thereby, the pogo pins 41 are aligned with the electrode pads 23 in a plane of arrangement of the pogo pins 41. In other words, the alignment between the probe card 20 and pogo pins 41 in the X- and Y-directions is effected.

When the test head 30 is rotated to the test position, the connection ring 40 is engaged at the test position by the engaging member 34.

A support mechanism for supporting the connection unit 40 on the test head 30 will now be described.

A disk-like support board 44 is fixed on the upper end of the connection unit 40. The connection unit 40 is movably supported on the test head 30 by means of the support board 44. Specifically, the support board 44 comprises a support mechanism which can allow the test head 30 to move in the intersecting X- and Y-directions on the plane of arrangement of pogo pins 41, in the Z-direction perpendicular to the X- and Y-directions, in the θ-direction (rotational direction), and in the slanting direction.

Figure 5:
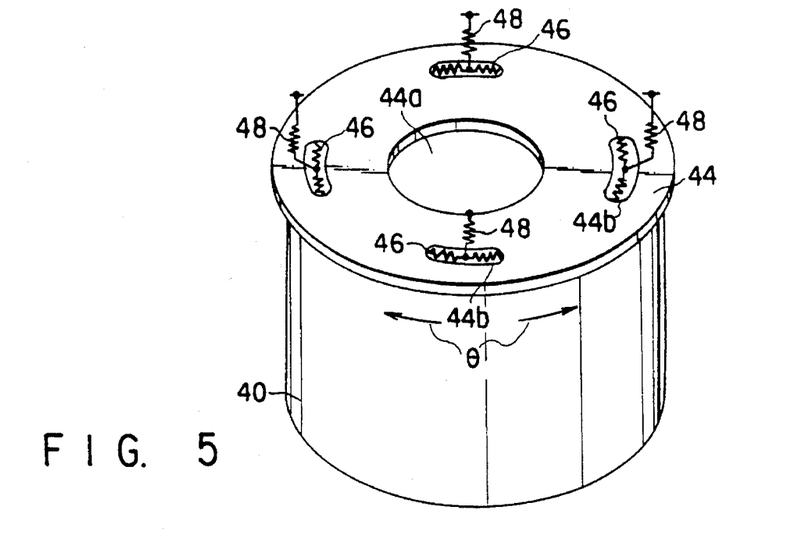
FIG. 5 shows a support mechanism for supporting the connection ring on a test head.

The support mechanism will now be described with reference to FIG. 5. As is shown in FIG. 5, the support board 44 has a hole 44a at its center portion. A plurality of attachment holes 44b are formed at a predetermined radial distance from the center of the support board 44. In FIG. 5, the attachment holes 44b are schematically illustrated as holes for situating parts used for attitude control (described later). Actually, the attachment holes 44b have such a structure as to fully perform their functions.

A first elastic member 46 is situated within each attachment hole 44b in the circumferential direction of the hole 44b. A second elastic member 48 extending vertically upwards is situated at a middle portion of the first elastic member 46. The second elastic member 48 connects the test head and the middle portion of the first elastic member 46. The first elastic members 46 are provided to make the connection unit 40 movable in the X- and Y-directions in the plane of arrangement of pogo pins 41 and in the rotational θ-direction in FIG. 5. The second elastic members 48 make the connection unit 40 movable in the vertical direction (Z-direction) and in the slanting direction.

By the above supporting mechanism, the attitude of the support board 44 and that of the connection unit 40 attached to the support board 44 can be freely varied. In other words, the connection unit 40 is movably supported on the test head 30.

The operation of the testing apparatus having the above structure will now be described.

Figure 6:
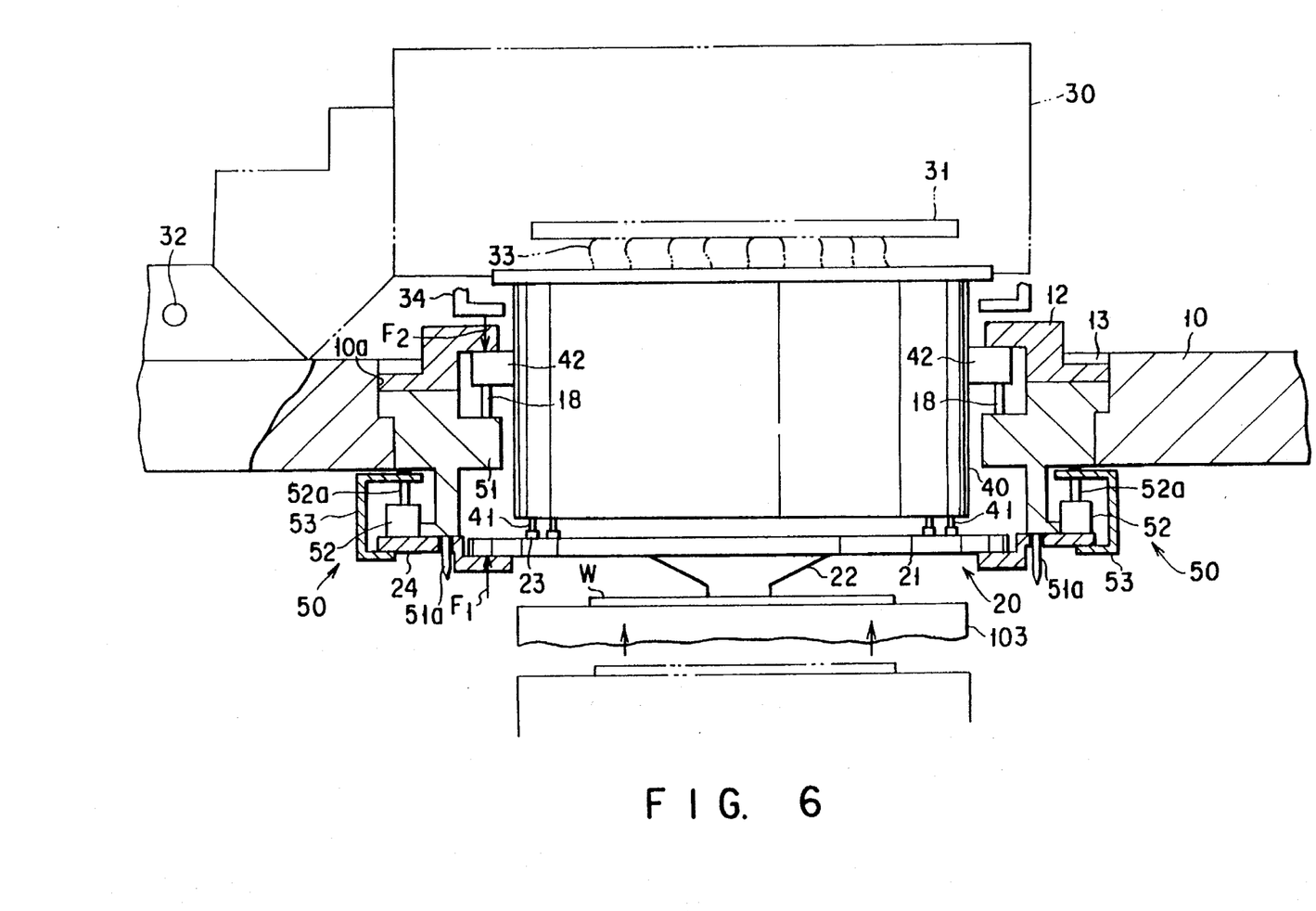
FIG. 6 shows schematically the main portion of the testing apparatus according to the embodiment in the state in which a test operation is performed.

Before the test head 30 is swung from the retreat position towards the test position the z-θ stage 103 on which the semiconductor wafer W is fixed is set in the lower non-test position, as indicated by a two-dot-and-dash line in FIG. 6. In addition, the driving mechanism 50 is set in the state in which the piston 52a of cylinder 52 is retreated, as shown in FIG. 1. Thus, the card holder 24 supporting the probe card 20 is maintained in the lower wait position.

On the other hand, by the initial state of the rotational driving member 14, the engaging member 12 is set in the first position in which the positions of the flanges of the connection unit 40 to be swung to the test position correspond to the notches 12c.

If the testing apparatus is changed from the non-test state to the test state, the test head 30 is swung from the retreat position to the test position by a swinging mechanism (not shown).

If the test head 30 is swung, the connection unit 40 is inserted in the hole 12b of the engaging member 12 before the test head 30 reaches the test position. In this case, the flanges 42 of the connection unit 40 pass through the notches 12c of the engaging member 12 and enter the engaging member 12. At the same time, the guide pins 18 with conical tip portions are inserted into the holes 43, and thereby the connection unit 40 is guided by the guide pins 18 and the pogo pins 41 are aligned with the electrode pads 23 in the plane of arrangement of pogo pins 41. In this case, since the connection unit 40 is movably supported on the test head 30 by means of the supporting mechanism shown in FIG. 5, the connection unit 40 can be guided by the guide pins 18 irrespective of the attitude of the test head 30.

If the test head 30 reaches the test position, the test head 30 is held to the test position by the engaging member 34. If the test head 30 stops at the test position, the engaging member 12 is shifted to the second position by the rotational driving member 14 so that the stoppers 12d of the engaging member 12 are made to face the flanges 42 of the connection unit 40. In other words, upward movement of the connection unit 40 is prevented by the stoppers 12d.

Even if the test head 30 is set in the test position, the probe card 20 is still set in the lower position. Thus, the probe card 20 is not electrically connected to the pogo pins 41 of the connection unit 40. In this case, the driving mechanism 50 may be set such that the pogo pins 41 come into weak contact with the probe card 20, if a load on the probe card 20 is light.

In the conventional case where the connection ring 40 is fixed to the test head 30, when the test head 30 is swung, pogo pins situated at a shorter rotational radial distance from the support shaft of the test head 30 (i.e. pogo pins nearer to the support shaft) come into contact with the probe card earlier than pogo pins situated at a longer rotational radial distance from the support shaft. While pogo pins situated at the shorter rotational distance press the probe card and exert an excessive buckling load on the probe card until the pogo pins at the longer rotational radial distance come into contact with the probe card.

However, in the apparatus with the above structure, the support board 44 is movably supported on the test head 30. Thus, when the pogo pins situated at the shorter rotational radial distance are put in contact with the probe card 20, the support board 44 is inclined and the pogo pins are prevented from exerting an excessive pressure on the probe card 20, thereby reducing to substantially zero the possibility that the pogo pins situated at the shorter rotational radial distance are buckled. Moreover, since the connection member 40 is guided and positioned by the guide pins 18, the pressure acting on the pogo pins can be further reduced.

When the test head 30 and connection unit 40 are held to the test position, the probe card 20 supported on the card holder 24 is lifted from the wait position to the upper test position by the driving mechanism 50, with the surface of the probe card 20 kept horizontal. In accordance with the rising of the probe card 20, the connection unit 40 also rises. Specifically, the probe card 20 rises to come into contact with the pogo pins 41 of the connection unit 40 and thereby the connection unit 40 is raised. Accordingly, as shown in FIG. 6, the flanges 42 come into contact with the lower surfaces of the stoppers 12d of the engaging member 12.

When the probe card 20 is raised to the test position by the driving mechanism 50 and the flanges 42 are put in contact with the lower surfaces of the stoppers 12d of the engaging member 12, a pressure (a force expressed by F1 in FIG. 6) corresponding to the degree of rising of the probe card 20 acts on the probe card 20, as shown in FIG. 6. A reaction force F2 against force F1 acts on the flanges 42 of the connection unit 40 from the stoppers 12d in the opposite direction. Thereby, the pogo pins 41 can surely be electrically connected to the electrode pads 23 in the state in which the pogo pin arrangement plane is parallel to the probe card 20. The stroke of the cylinder 52 of the driving mechanism 50 is properly chosen to set the required pressure to an optimal value.

Figure 7:
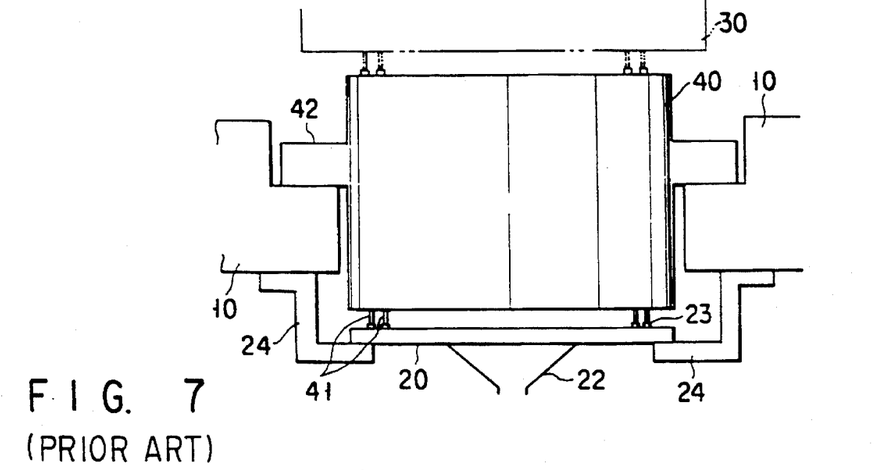
FIG. 7 shows schematically a main portion of a conventional testing apparatus.

In this case, a pressure required for electrical connection between the pogo pins 41 and electrical pads 23 is provided by the lifting of the probe card 20 by the driving mechanism 50 and the limitation to the movement of the connection ring 40 by the engaging member 12. Therefore, the pressure required for electrical connection between the pogo pins 41 and electrical pads 23 does not directly act on the head plate 10, unlike the prior art. In other words, in the prior art, as shown in FIG. 7, flanges 42 are placed on the head plate 10 and the connection unit is fixed to the test head. Thus, the pressure required for electrical connection between the pogo pins 41 and electrode pads 23 acts directly on the head plate 10 and bending deformation occurs in the head plate 10 due to bending moment. By contrast, in FIG. 6, the flanges 42 are not placed on the head plate 10 and moreover the connection ring 40 is movable. Thus, no bending moment occurs in the head plate 10, unlike the prior art. Accordingly, no bending deformation occurs in the head plate 10 and bending of the probe card 20 is prevented.

In other words, since the probe card 20 and connection unit 40 receive a pressure to camp them, they do not exert an excessive pressure to the outside. Thus, bending deformation of the head plate 10 does not occur, as stated above.

If the testing apparatus is set in the test position by the above-described procedure, no bending of the probe card 20 occurs. Accordingly, good parallelism between the semiconductor wafer W and a plane defined by the tip portions of the probes 22 of probe card 20 is ensured. Thereafter, as indicated by a solid line in FIG. 6, the stage 103 rises and the electrode pads of the semiconductor wafer W come into contact with the probes 22. Then, an electrical test is performed.

As has been described above, according to the testing apparatus of the above embodiment, only by applying a pressure to clamp the probe card 20 and connection ring 40, can an excessive pressure to cause a bending moment be prevented from acting on the head plate 10. In addition, when the test head 30 is swung from the retreat position to the test position, the semiconductor wafer mounting stage 103 is lowered and the probe card 20, too, is lowered. Thus, neither the probe card nor semiconductor wafer receives shock.

Besides, the contact of the probe card 20 with the pogo pins 41 of connection unit 40 is effected after the test head 30 is set in the test position and the card surface of the probe card 20 is kept horizontal. Thus, even in the case of the testing apparatus wherein the test head is moved by a swinging system, the pogo pins 41 do not slide over the electrode pads 23 of the probe card 20. Thereby, positional displacement of each pogo pin can be prevented.

Figure 8:
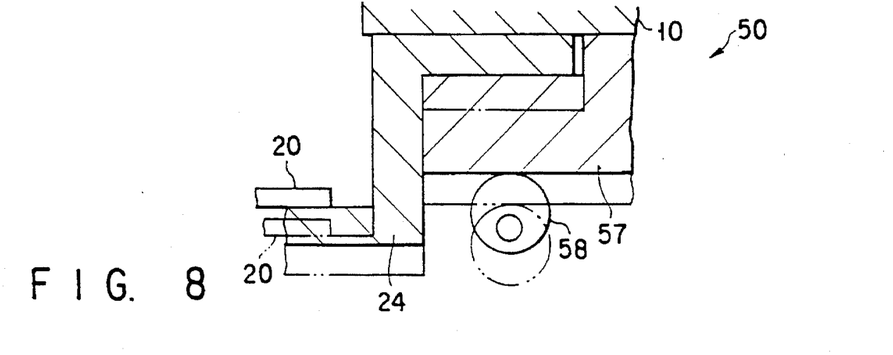
FIG. 8 is a cross-sectional view showing a modification of a driving mechanism.

In the above embodiment, the driving mechanism 50 adopts the air cylinder mechanism. However, as shown in FIG. 8, an eccentric cam mechanism may be used. Specifically, the eccentric cam mechanism comprises an interlocking member 57, which is attached to the lower surface of that portion of the care holder 24, which faces the head plate 10, and an eccentric cam 58. The interlocking member 57 is put in contact with the eccentric cam 58. When the eccentric cam 58 is rotated by a rotating member (not shown), interlocking member 57 rises and falls along a guide (not shown). In other words, the eccentric cam 58 is shifted between a first position (indicated by a two dot-and-dash line) where the degree of eccentricity is minimum and a second position where the degree of eccentricity is maximum. When the eccentric cam 58 is in the first position, the interlocking member 57 is set in the lower position (indicated by the two-dot-and-dash line) accordingly, and the probe card 20 is kept in the wait position. On the other hand, when the eccentric cam 58 is shifted to the second position, the interlocking member 57 rises along the guide member and the card holder 20 rises accordingly. Thus, the probe card 20 is shifted to the test position. In this case, the maximum degree of eccentricity of the eccentric cam 58 is adjusted at such a degree that the flanges 42 of the connection ring 40 may come into contact with the stoppers 12d under a predetermined pressure.

Figure 9:
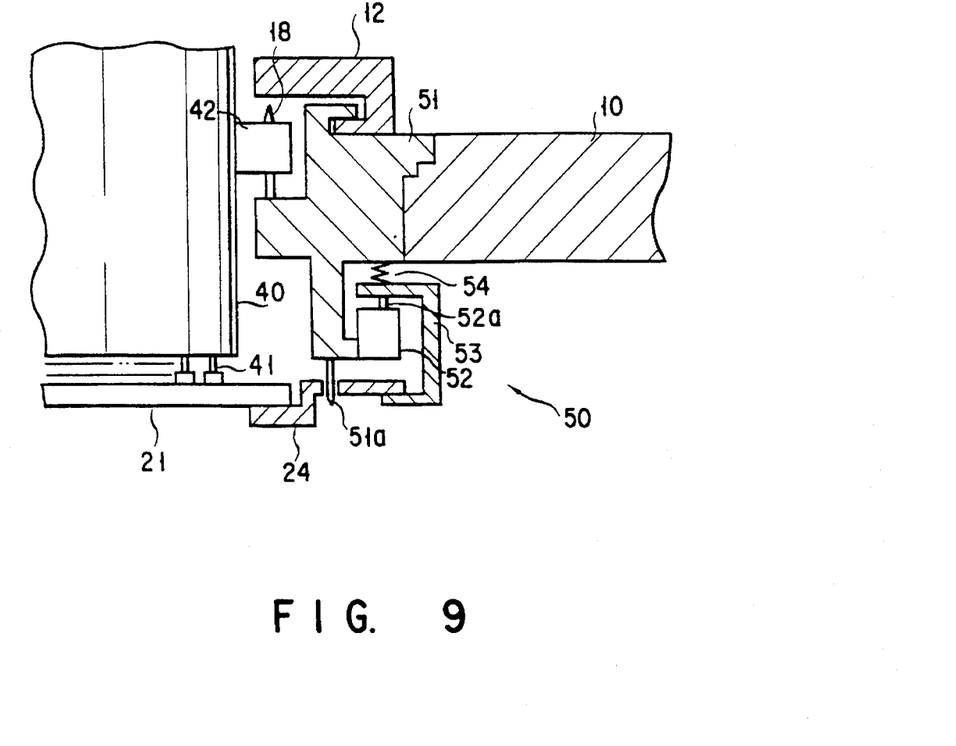
FIG. 9 is a cross-sectional view showing a part of a testing apparatus according to another embodiment of the invention.
Figure 10:
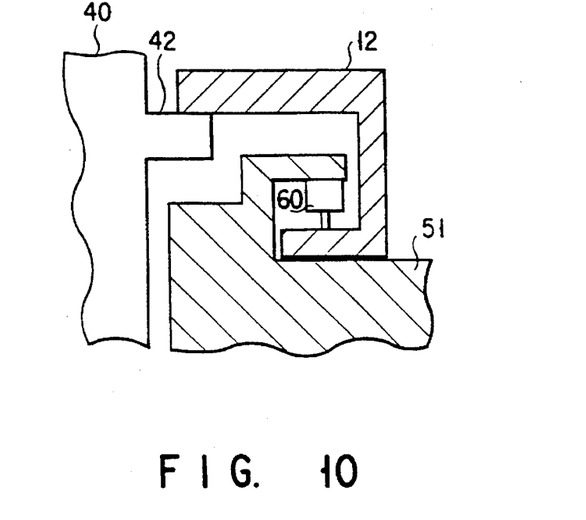
FIG. 10 is a cross-sectional view showing a modification of the testing apparatus shown in FIG. 9.

In addition, in the above example, the engaging member 12 is fitted in the hole 10a of the head plate 10. However, as is shown in FIG. 9, the engaging member 12 may be attached to the insert ring 51. In this case, as shown in FIG. 10, an air cylinder 60 may be provided between the engaging member 12 and the insert ring 51, thereby to move the engaging member 12 vertically.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A testing apparatus comprising:
   a probe card having a plurality of first contact elements to be put in contact with an object to be tested, and a plurality of electrodes electrically connected with the first contact elements;
   a test head to be shifted between a retreat position and a test position, for performing electrical measurement of the object in the test position;
   a connection member, having a plurality of second contact elements to be put in contact with the electrodes of the probe card in the test position, for electrically connecting the probe card with the test head, the connection member being supported by the test head;
   a support mechanism for movably supporting the connection member on the test head;
   guide means for guiding the connection member such that the second contact elements are aligned to the electrodes of the probe card in the test position;
   limiting means for limiting movement of the connection member towards the test head after the test head is moved to the test position; and
   fixing means for fixing the probe card in the state in which movement of the connection member is limited by the limiting means and the probe card is pressed on the connection member.

2. The apparatus according to claim 1, wherein each of said second contact elements has a pogo pin mechanism for enabling said each of the second contact elements to come into elastic contact with an associated one of said electrodes of the probe card.

3. The apparatus according to claim 1, wherein said support mechanism has a spring mechanism.

4. The apparatus according to claim 1, further comprising flexible wiring for connecting the test head to the second contact elements of the connection member.

5. The apparatus according to claim 1, wherein said limiting means includes:
   a limiting member switchable between an insertion permitting position where insertion of the connection member is permitted and a limiting position where movement of the connection member towards the test head is limited after the insertion of the connection member, when the test head is shifted from the retreat position to the test position; and
   a driving mechanism for switching the limiting member between the insertion permitting position and the limiting position.

6. The apparatus according to claim 5, wherein said connection member has flanges on a peripheral portion thereof, said limiting member has an insertion hole for insertion of the connection member in an upper wall thereof, notches continuous with the insertion hole and corresponding to the flanges, and stoppers, said flanges being situated to correspond to the notches when the connection member is in the insertion permitting position, and said flanges being situated to correspond to the stoppers when the connection member is in the limiting position.

7. The apparatus according to claim 1, wherein said fixing means has a cylinder mechanism.

8. The apparatus according to claim 1, wherein said fixing means has a cam mechanism.

9. The apparatus according to claim 1, wherein said guide means has a guide pin and a guide hole formed in the connection member for insertion of the guide pin.

10. The apparatus according to claim 9, wherein said guide hole is formed in at least one of the flanges.

11. The apparatus according to claim 1, further comprising a probe card holder for holding the probe card.

\* \* \* \* \*